United States Patent
Knausz (10) Patent No.: US 7,362,173 B1
(45) Date of Patent: Apr. 22, 2008

(54) SYSTEM AND METHOD FOR PROVIDING SLEW RATE ENHANCEMENT FOR TWO STAGE CMOS AMPLIFIERS

(75) Inventor: Imre Knausz, Fairport, NY (US)

(73) Assignee: National Semiconductor Corporation, Santa Clara, CA (US)

( * ) Notice: Subject to any disclaimer, the term of this patent is extended or adjusted under 35 U.S.C. 154(b) by 130 days.

(21) Appl. No.: 11/285,586

(22) Filed: Nov. 21, 2005

Related U.S. Application Data (60) Provisional application No. 60/717,989, filed on Sep. 16, 2005.

(51) Int. Cl.
*H03F 3/45* (2006.01)
*H03F 1/14* (2006.01)

(52) U.S. Cl. ..................... 330/253; 330/292
(58) Field of Classification Search .............. 330/292
See application file for complete search history.

(56) References Cited

U.S. PATENT DOCUMENTS 5,477,189 A * 12/1995 Koifman et al. ............ 330/253

OTHER PUBLICATIONS

R. Klinke et al., "A Very-High-Slew-Rate CMOS Operational Amplifier", IEEE Journal of Solid-State Circuits, vol. 24, No. 3, Jun. 1989, pp. 744-746.

K. Nagaraj, "CMOS Amplifiers Incorporating a Novel Slew Rate Enhancement Technique", IEEE 1990 Custom Integrated Circuits Conference, pp. 11.6.1-11.6.5.

Dennis M. Monticelli, "A Quad CMOS Single-Supply Op Amp with Rail-to-Rail Output Swing", IEEE Journal of Solid-State Circuits, vol. Sc-21, No. 6, Dec. 1986, pp. 1026-1034.

Antonio J. Lopez-Martin et al., "Low-Voltage Super Class AB CMOS OTA Cells with Very High Slew Rate and Power Efficiency", IEEE Journal of Solid-State Circuits, vol. 40, No. 5, May 2005, pp. 1068-1077.

Doug Gingrich, "Current Limiting and Slew Rate", www.phys.ualberta.ca/~gingrich/phys395/notes/node115.html, 1 page.

Baswa, S. et al., "Low-Voltage Micropower Super Class AB CMOS OTA", Electronics Letters, vol. 40, Issue 4, Feb. 19, 2004, pp. 216-217.

* cited by examiner

*Primary Examiner*—Steven J. Mottola (57) ABSTRACT

A slew rate enhancement circuit is disclosed for increasing a slew rate in a two stage CMOS amplifier. The slew rate enhancement circuit detects an input signal transition in the two stage CMOS amplifier. Depending on the polarity of the input signal transition the slew rate enhancement circuit turns on either (1) a first current source to charge a first compensation capacitor, or (2) a second current source to charge a second compensation capacitor. The slew rate enhancement circuit increases the slew rate by a factor of four to five and decreases the settling time of a voltage transition by a factor of three.

20 Claims, 8 Drawing Sheets

SYSTEM AND METHOD FOR PROVIDING SLEW RATE ENHANCEMENT FOR TWO STAGE CMOS AMPLIFIERS

CROSS-REFERENCE TO RELATED APPLICATION

This application claims the benefit of priority under 35 U.S.C. §119(e) (1) of provisional application Ser. No. 60/717,989 filed on Sep. 16, 2005, which is incorporated herein by reference for all purposes.

TECHNICAL FIELD OF THE INVENTION

The present invention is generally directed to manufacturing technology for semiconductor devices and, in particular, to circuitry for providing slew rate enhancement for two stage complementary metal oxide semiconductor (CMOS) amplifiers.

BACKGROUND OF THE INVENTION

In an operational amplifier circuit the slew rate is a measure of the variation in the output voltage in terms of volts per unit time. The higher the slew rate, the quicker an output voltage of the operational amplifier can reach a desired target voltage value. It is therefore desirable to maximize the slew rate in an operational amplifier circuit.

Two different types of approaches have been taken to increase the slew rate in single state operational transconductance amplifier (OTA) circuits. The first approach has been to provide an additional differential input stage that increases the bias current of the operational amplifier in order to enhance the slew rate. This type of approach is referred to in this document as a "Bias Boost" approach. An example of the Bias Boost approach is described in a paper by R. Klinke and B. J. Hosticka entitled "A Very-High-Slew-Rate CMOS Operational Amplifier," IEEE Journal of Solid-State Circuits, Volume 23, No. 3, pp. 744-746 (June 1989).

Figure 1:
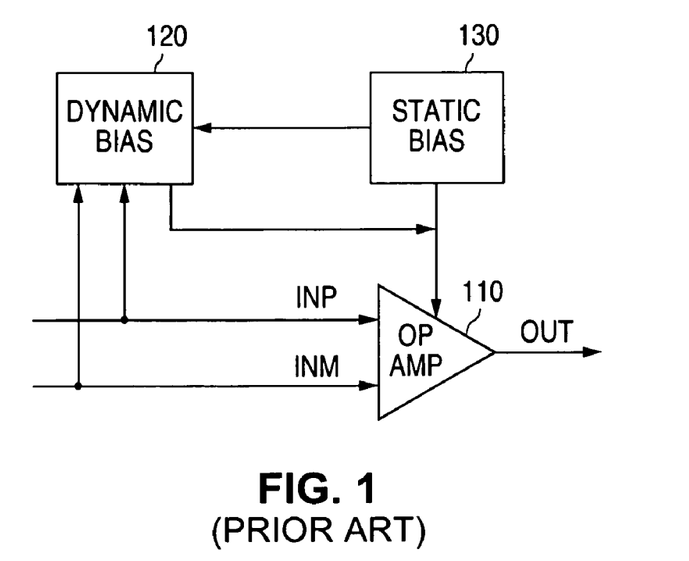
FIG. 1 illustrates a block diagram of a circuit to describe a prior art Bias Boost method of providing slew rate enhancement.

FIG. 1 illustrates the Bias Boost principle applied to an operational amplifier 110. As shown in FIG. 1, a dynamic bias circuit 120 monitors the signals at the input of operational amplifier 110. When a large differential signal is detected, the dynamic bias circuit 120 temporarily increases the bias current to enhance the slew rate. The static bias circuit 130 provides the bias current during the small signal operation. The static bias circuit 130 determines the small signal properties of the operational amplifier 110 when the dynamic bias circuit 120 is not operational. Only the presence of large differential signals at the input can turn on the dynamic bias current from dynamic bias circuit 120.

The Bias Boost approach necessarily requires extra circuitry. It is sometimes very difficult to prevent the extra circuitry from degrading the electrical characteristics of the underlying operational amplifier. Another example of the Bias Boost approach is described in a paper by S. Baswa, A. J. Lopez-Martin, R. G. Carvajal, and R. Ramirez-Angulo entitled "Low-Voltage Micropower Super Class AB CMOS OTA," Electronics Letters, Volume 40, pp. 216-217 (February 2004).

The Bias Boost method is not desirable for two stage CMOS amplifiers. The Bias Boost method is not compatible with some commonly used operational amplifier architectures. For example, boosting the tail current only serves to enhance the slew rate in one direction in a folded cascode amplifier. The folded cascode amplifier is the basis for almost all low power amplifiers because (1) it is very easy to add a buffer stage for driving large capacity loads, (2) it has a very high gain, and (3) it is relatively easy to add a secondary complementary differential input stage for rail to rail operation.

The second approach has been to add current directly into the load in order to help the operational amplifier drive the output capacitance. This type of approach is referred to in this document as a "Load Boost" approach. An example of the Load Boost approach is described in a paper by K. Nagaraj entitled "CMOS Amplifiers Incorporating A Novel Slew Rate Enhancement Technique," IEEE 1990 Custom Integrated Circuits Conference, pp. 11.6.1-11.6.5 (1990).

Figure 2:
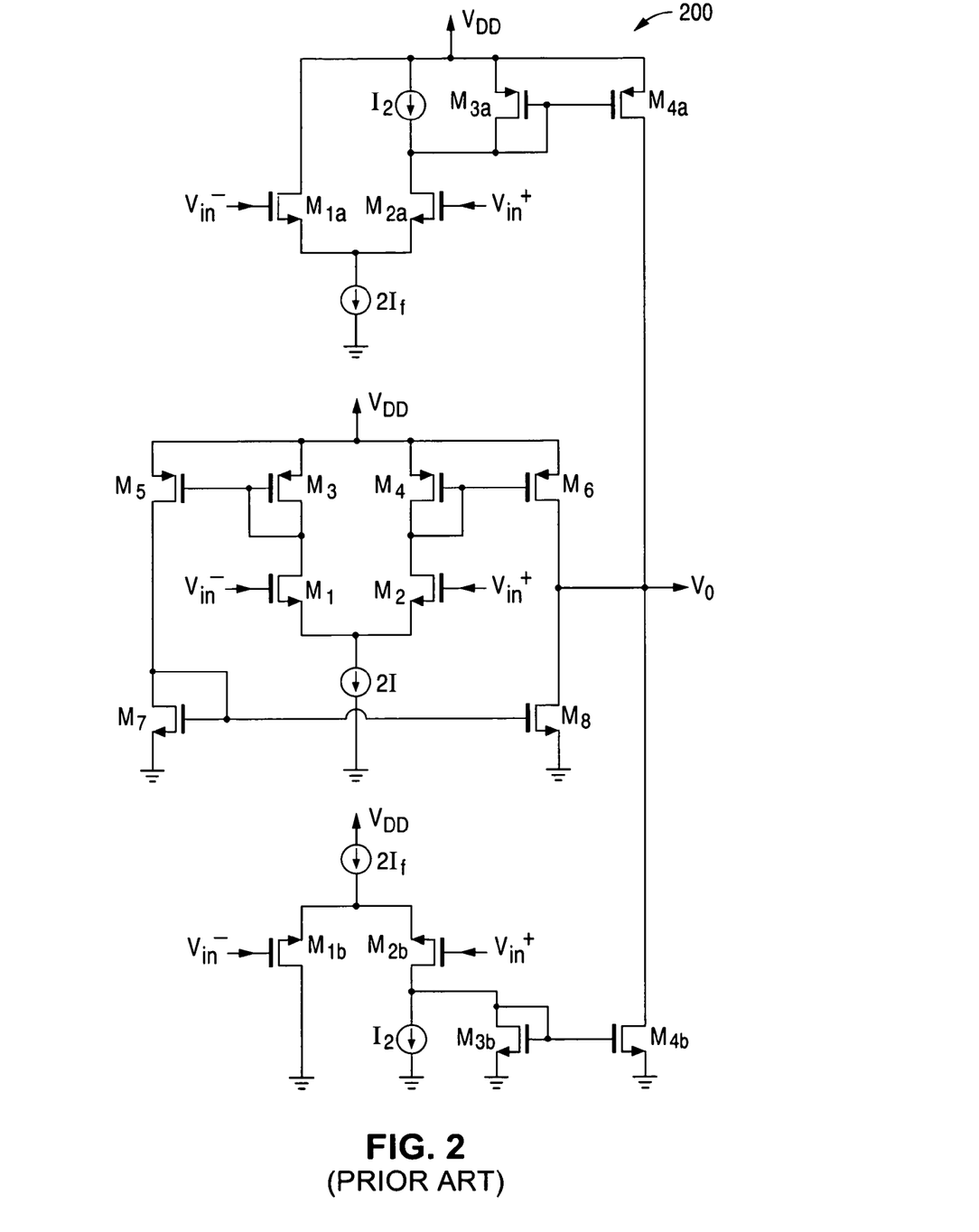
FIG. 2 illustrates a circuit diagram to describe a prior art Load Boost method of providing slew rate enhancement.

The increased slew rate capability is provided by an auxiliary circuit that is automatically activated during fast signal transitions. The slew enhancing currents are applied directly to the output and not to the bias of the main amplifier. This approach avoids the problems that result if the main amplifier has to handle large transient currents. FIG. 2 illustrates an illustrative prior art Load Boost circuit 200 for applications that present relatively small capacitative loads but require very high slew rates.

The Load Boost method is not desirable for two stage CMOS amplifiers. The Load Boost method is deficient because positive feedback into the amplifier's output can easily lead to oscillations if the slew detect circuit is too slow or has a differential trigger voltage that is too small. Even when properly compensated, the Load Boost method can lead to excessive overshoot and excessive recovery time. This means that the Load Boost method is a very uncontrolled manner with which to drive the load.

For the reasons described above, the prior art approaches are not desirable for use in two stage CMOS amplifiers. Therefore, it would be advantageous to have a more efficient system and method for providing slew rate enhancement in two stage CMOS amplifiers.

Before undertaking the Detailed Description of the Invention below, it may be advantageous to set forth definitions of certain words and phrases used throughout this patent document: the terms "include" and "comprise," as well as derivatives thereof, mean inclusion without limitation, the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

The term "controller" means any device, system, or part thereof that controls at least one operation. A controller may be implemented in hardware, software, firmware, or combination thereof. It should be noted that the functionality associated with any particular controller may be centralized or distributed, whether locally or remotely.

Definitions for certain words and phrases are provided throughout this patent document, those of ordinary skill in the art should understand that in many, if not most instances, such definitions apply to prior uses, as well as to future uses, of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

FIGS. 3 through 10, discussed below, and the various embodiments used to describe the principles of the present invention in this patent document are by way of illustration only and should not be construed in any way to limit the scope of the invention. Those skilled in the art will understand that the principles of the present invention may be implemented in any type of suitably arranged two stage CMOS operational amplifier circuit.

Figure 3:
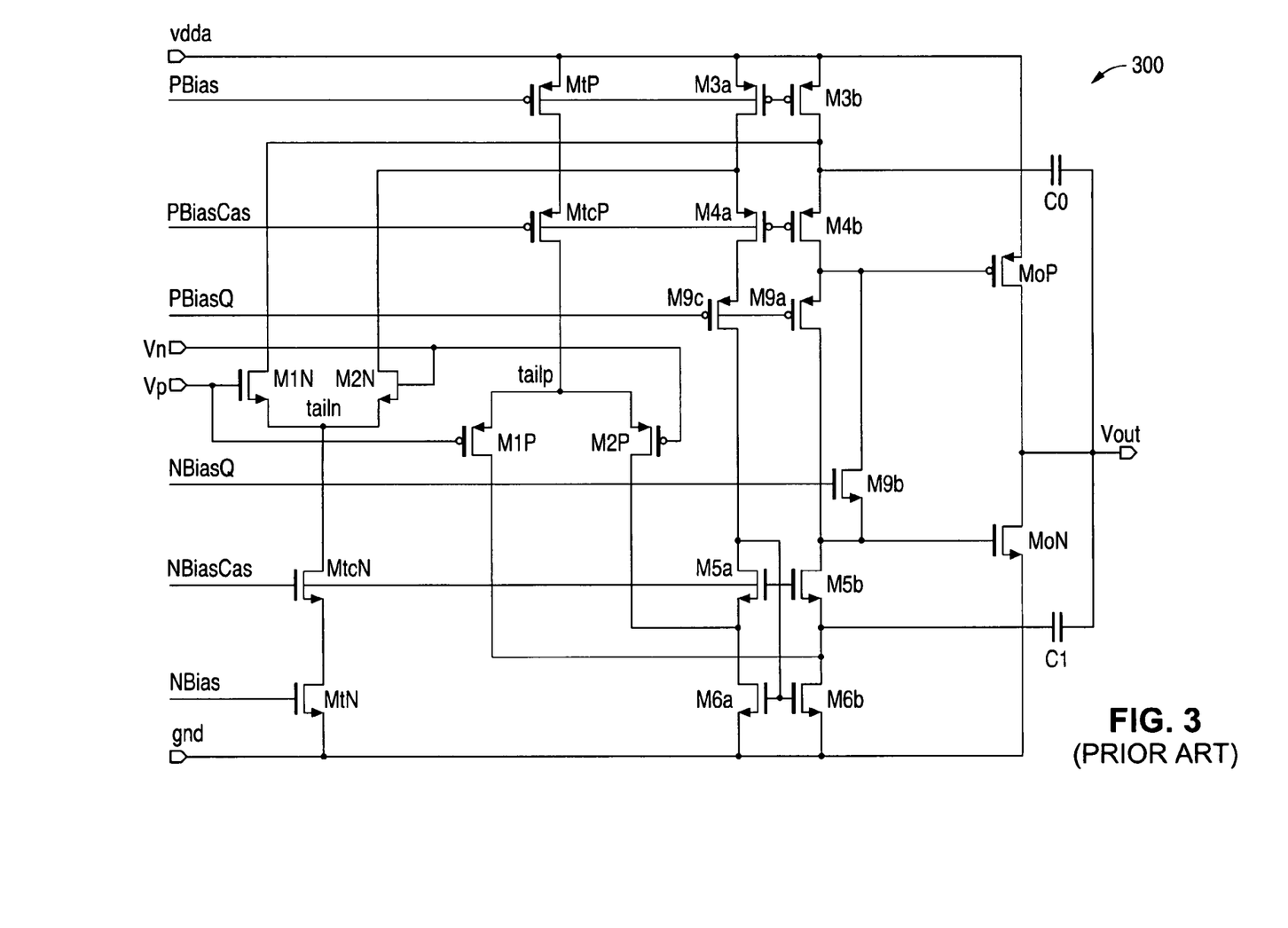
FIG. 3 illustrates a prior art operational amplifier circuit having a folded cascode first stage and a class AB common source output stage.

FIG. 3 illustrates a prior art operational amplifier circuit 300. Operational amplifier circuit 300 comprises a first stage and a second stage. The first stage of operational amplifier circuit 300 comprises a folded cascode circuit with a dual polarity front end. The second stage of operational amplifier circuit 300 comprises a class AB common source stage. The compensation method employed in operational amplifier circuit 300 is a cascoded Miller compensation.

Figure 4:
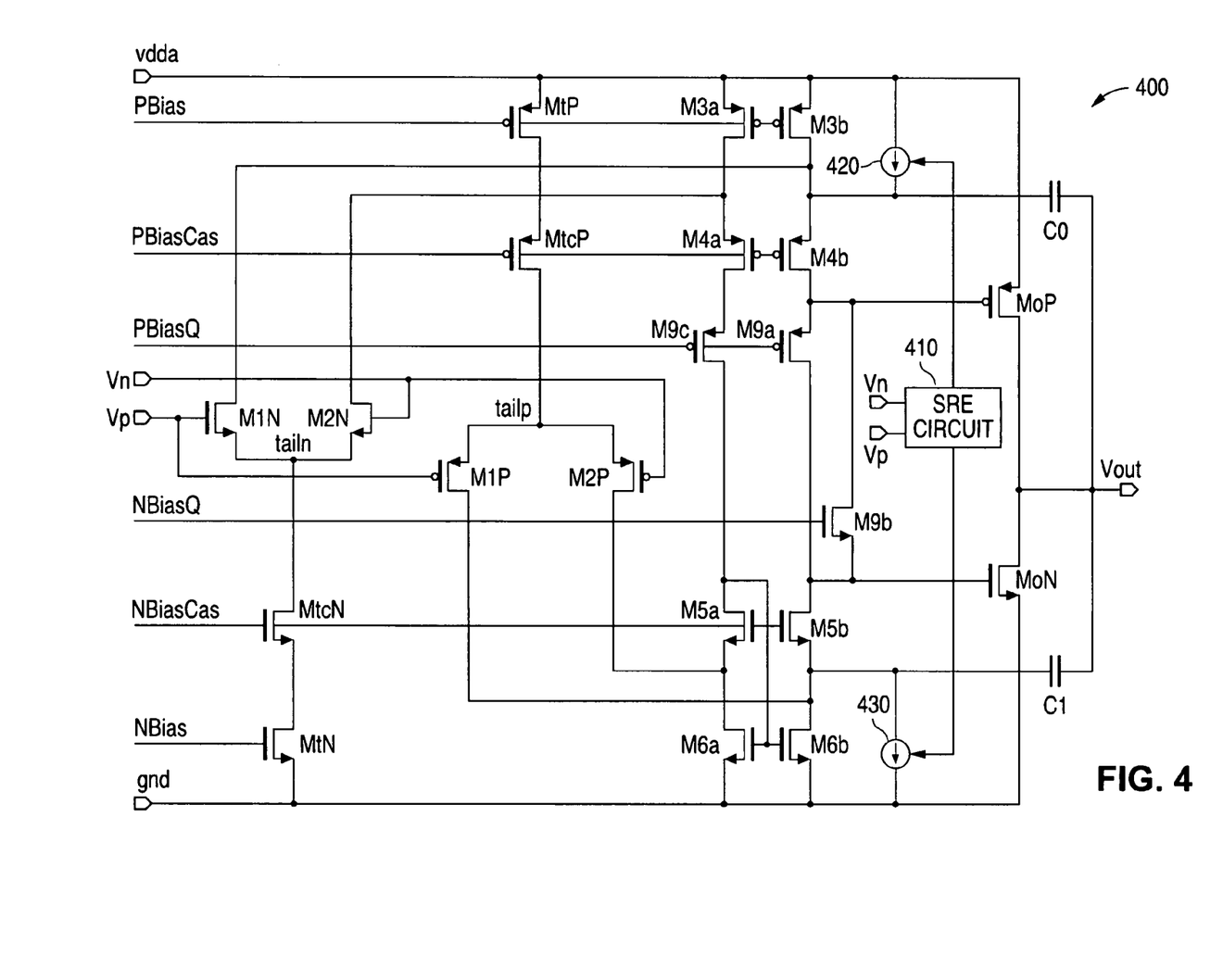
FIG. 4 illustrates a slew rate enhancement (SRE) circuit of the present invention coupled to the operational amplifier circuit shown in FIG. 3.

FIG. 4 illustrates an operational amplifier circuit 400 constructed in accordance with the principles of the present invention. Operational amplifier 400 is similar in structure to operational amplifier 300 except that operational amplifier 400 comprises a slew rate enhancement (SRE) circuit 410 of the present invention. A first current source 420 and second current source 430 are also coupled to operational amplifier 400. The slew rate enhancement (SRE) circuit 410 controls the operation of the first current source 420 and controls the operation of the second current source 430.

Slew rate enhancement (SRE) circuit 410 has a first input for receiving the Vn input signal that is input to operational amplifier 400 and a second input for receiving the Vp input signal that is input to operational amplifier 400. Slew rate enhancement (SRE) circuit 410 receives the Vn and Vp input signals. If a large voltage difference is detected (on the order of a few hundred millivolts), then slew rate enhancement (SRE) circuit 410 sends a signal to turn on either first current source 420 or second current source 430. Which current source is turned on depends upon the polarity of the input signal transition.

For example, if the Vp input signal encounters a fast high transition (indicating a positive input step), then the Vn input signal will lag behind. Then the slew rate enhancement (SRE) circuit 410 determines that the Vp input signal is greater than the Vn input signal, and turns on current source 430 to help charge the capacitor C1.

Similarly, if the Vn input signal encounters a fast high transition (indicating a positive input step), then the Vp input signal will lag behind. Then the slew rate enhancement (SRE) circuit 410 determines that the Vn input signal is greater than the Vp input signal, and turns on current source 420 to help charge capacitor C0.

Figure 5:
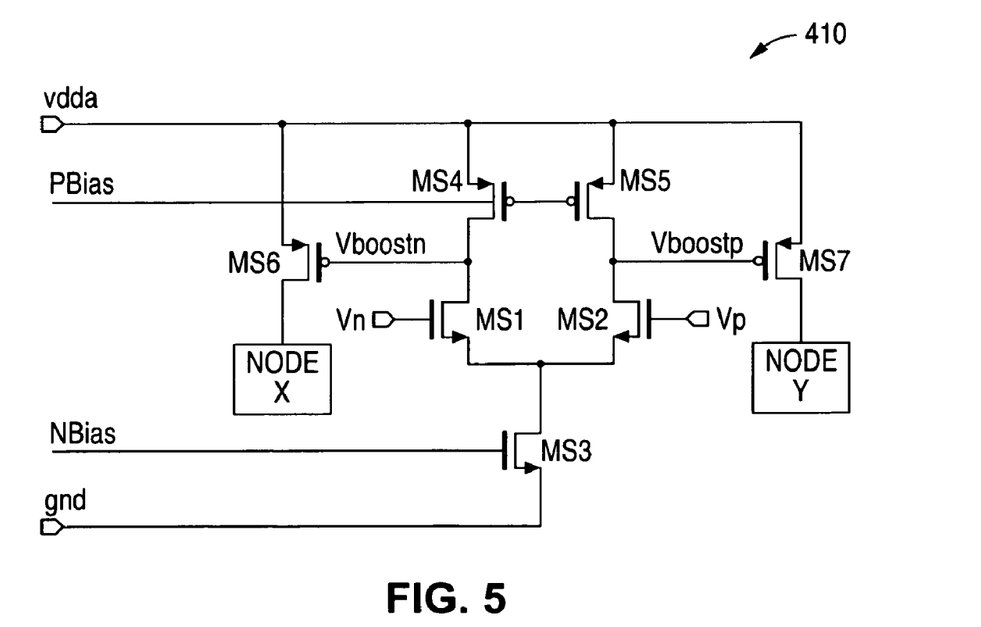
FIG. 5 illustrates a more detailed circuit diagram of the slew rate enhancement (SRE) circuit of the present invention.

FIG. 5 illustrates a more detailed circuit diagram of the slew rate enhancement (SRE) circuit 410 of the present invention. Slew rate enhancement (SRE) circuit 410 comprises three NMOS transistors MS1, MS2 and MS3 and four PMOS transistors MS4, MS5, MS6 and MS7 coupled together as shown in FIG. 5. Transistors MS4 and MS5 are biased as current sources with three fourths (¾) $I_B$. Transistor MS3 is biased with a current of $I_B$.

At equilibrium (when Vn equals Vp) the transistors MS4 and MS5 are current starved and operating in the triode region. This causes them to pull their drains to the power supply rail because they are "stronger" than transistor MS3. This turns off the current injectors (transistors MS6 and MS7).

During a slew condition, such as when Vp is greater than Vn, all of the current of transistor MS3 wants to go through transistor MS2. Now the equilibrium is reversed and transistors MS2 and MS3 go into the linear region and pull the Vboostp node down, which in turn drives transistor MS7 to turn on. The same action occurs for a negative going transition.

The slew rate enhancement (SRE) circuit 410 has several advantages. It is very fast, compact, low power, tolerant to process variations, and does not require any resistors. The slew rate enhancement (SRE) circuit 410 is low power because its bias current can easily be scaled down from the main bias current. The limitation on power is the current required to slew Vboostn and Vboostp much faster than the intrinsic slew rate of the operational amplifier.

Transistors MS6 and MS7 (and interconnect parasitics) constitute the capacitance on the Vboostn and Vboostp nodes. A "SRE-slew to opamp-slew" ratio of approximately five (5) was found to work well through simulation. The slew rate enhancement (SRE) circuit 410 resists malfunction because turning off transistor MS3 will only serve to enhance the ability of transistors MS4 and MS5 to pull the Vboostn and Vboostp nodes high.

Figure 6:
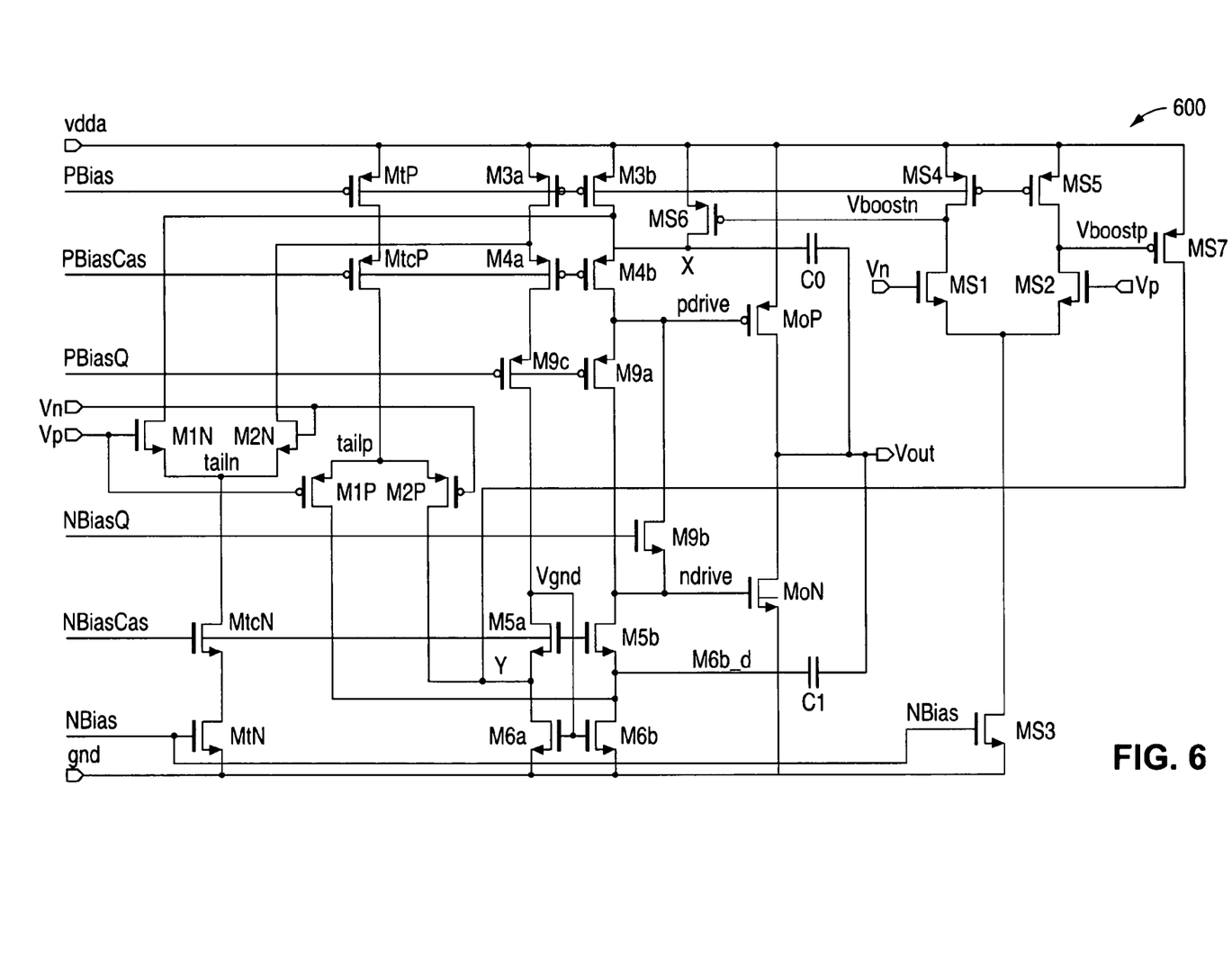
FIG. 6 illustrates a circuit diagram of an operational amplifier circuit showing one advantageous embodiment of a connection of the slew rate enhancement (SRE) circuit of the present invention.

FIG. 6 illustrates a circuit diagram of an operational amplifier circuit 600 showing one advantageous embodiment of a connection of the slew rate enhancement (SRE) circuit 410 of the present invention. There are several options for connecting the slew rate enhancement (SRE) circuit 410 to an operational amplifier. Connecting the boost circuit for negative going transitions is straightforward. As shown in FIG. 6, the X node at the drain of transistor MS6 is simply connected to the compensation capacitor C0. Transistor MS6 is analogous to the first current source 420.

Now consider the connection for the Y node at the drain of transistor MS7. Transistor MS7 is analogous to second current source 430. A first approach for connecting the Y node for positive edge slew rate enhancement is to sum the boost current into the tail of the PMOS differential pair (transistor M1P and transistor M2P). This first approach has a major drawback in that it does not work near the top of the common mode range.

Referring to FIG. 4, one can see that for a positive step close to the power supply rail, transistor M1P is immediately cut off. The node tailp will follow Vn to the final value, and after tailp gets within a $V_{th}+V_{DS-ON}$, then transistor M2P will be off. The boost current can no longer help because there is no path to the compensation capacitor C1.

The second approach for connecting the Y node is to add an NMOS turnaround for the current coming out of transistor MS7 and summing it to the drain node of transistor M6b. This second approach solves the common node problem. However, the circuit has a very slow turn off time and can create significant overshoot. If the Y node is connected to a turn-around current mirror, there is no quick path to discharge the NMOS turn-around when transistor MS7 is turned off after the positive going slew condition is gone.

The ideal solution is to sum the current of transistor MS7 into the drain of transistor M6a. This solution yields the benefits of both the aforementioned solutions because any current added into transistor M6a will be mirrored to transistor M6b. This is the same as adding a current source in parallel with transistor M6b. This solution is shown in the operational amplifier 600 shown in FIG. 6.

Figure 7:
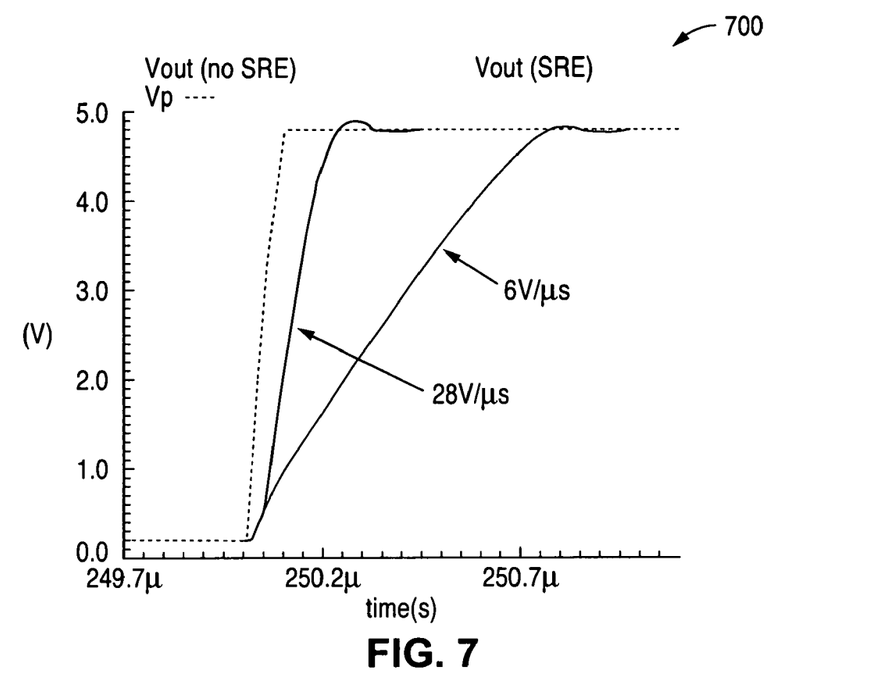
FIG. 7 illustrates a graph of voltage versus time showing the transient response of the operational amplifier circuit shown in FIG. 4 as the voltage is increased.

FIG. 7 illustrates a graph 700 of voltage versus time showing the transient response of the operational amplifier circuit shown in FIG. 4 as the voltage is increased. The graph 700 is a simulation result of the operational amplifier operated with a load of one hundred ohms (100 Ω) of resistance in series with one hundred picofarads (100 pF) of capacitance. The quiescent current of the operational amplifier is forty microamperes (40 μA) and the slew rate enhancement (SRE) circuit's quiescent current is six microamperes (6 μA). The tail current is approximately six microamperes (6 μA) and the compensation capacitor has a capacitance of approximately one picofarad (1 pF).

As shown in FIG. 7, the slew rate for increasing voltage without the slew rate enhancement (SRE) circuit of the present invention is approximately six volts per microsecond (6 volts/μsec). The slew rate for increasing voltage with the slew rate enhancement (SRE) circuit of the present invention is approximately twenty eight volts per microsecond (28 volts/μsec). The simulated slew rate is increased by a factor of four and two thirds.

The settling time for increasing voltage is decreased by a factor of three. That is, the settling time with the slew rate enhancement (SRE) circuit is approximately one third of the settling time that is required without the slew rate enhancement (SRE) circuit.

Figure 8:
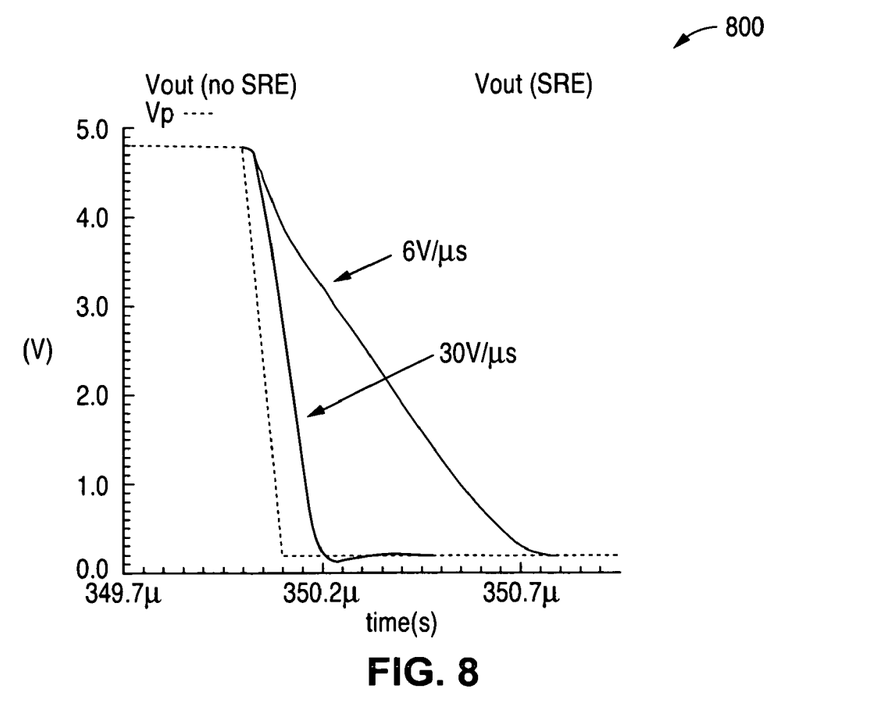
FIG. 8 illustrates a graph of voltage versus time showing the transient response of the operational amplifier circuit shown in FIG. 4 as the voltage is decreased.

FIG. 8 illustrates a graph 800 of voltage versus time showing the transient response of the operational amplifier circuit shown in FIG. 4 as the voltage is decreased. The graph 800 is a simulation result of the operational amplifier operated with the same load and parameters described above with reference to FIG. 7.

As shown in FIG. 8, the slew rate for decreasing voltage without the slew rate enhancement (SRE) circuit of the present invention is approximately six volts per microsecond (6 volts/μsec). The slew rate for decreasing voltage with the slew rate enhancement (SRE) circuit of the present invention is approximately thirty volts per microsecond (30 volts/μsec). The simulated slew rate is increased by a factor of five.

The settling time for decreasing voltage is decreased by a factor of three. That is, the settling time with the slew rate enhancement (SRE) circuit is approximately one third of the settling time that is required without the slew rate enhancement (SRE) circuit.

The slew rate enhancement (SRE) circuit of the present invention increases the total static power consumption of the operational amplifier by approximately fifteen percent (15%). The trade-off is that the slew rate is increased by a factor of four (4) to five (5) and the settling time is increased by a factor of about three (3).

Figure 9:
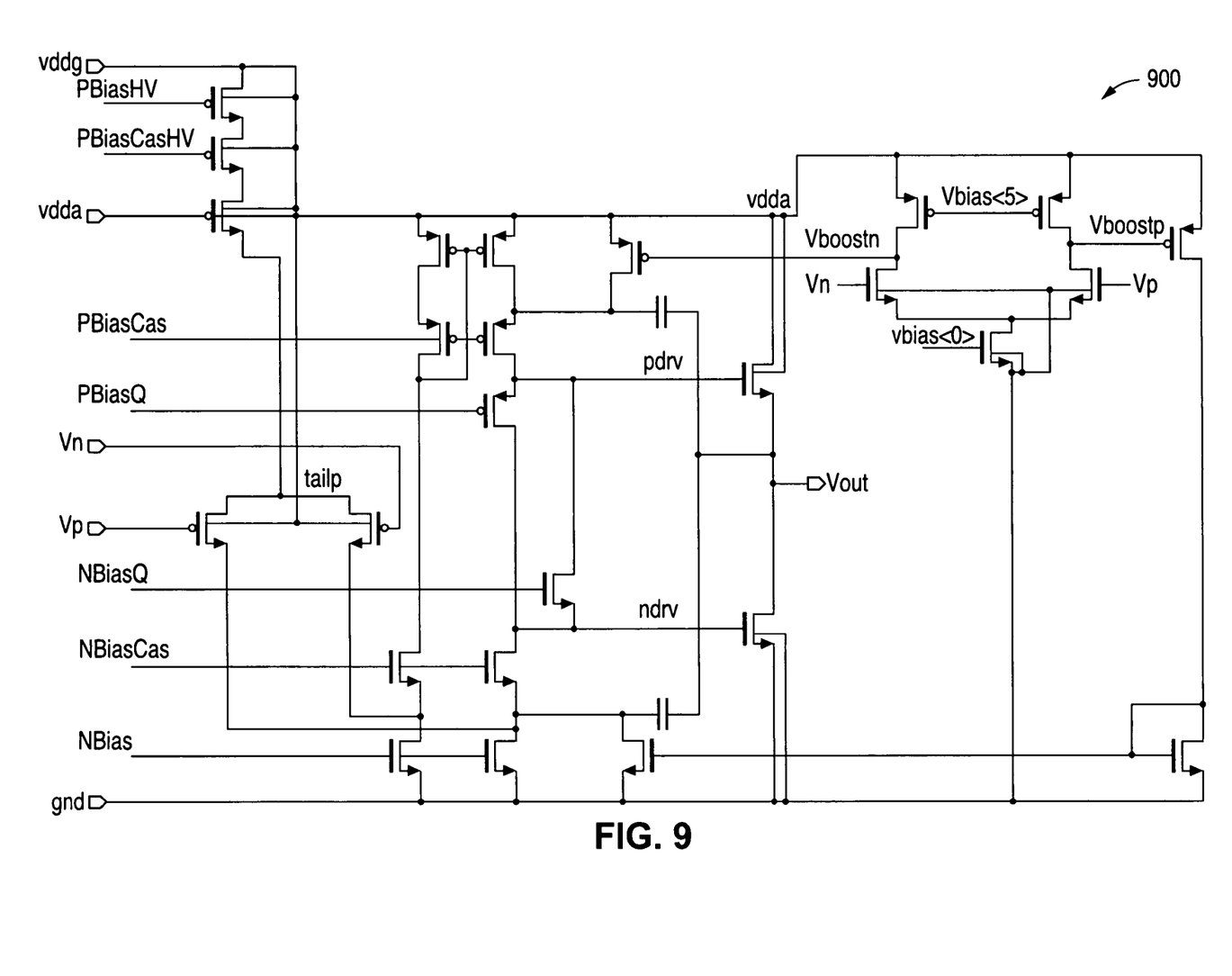
FIG. 9 illustrates a slew rate enhancement (SRE) circuit of the present invention coupled to a low power operational amplifier circuit.

The slew rate enhancement (SRE) architecture of the present invention can also be extended to ultra low power operational amplifiers that have a total quiescent current of approximately one microamperes (1 μA). FIG. 9 illustrates a slew rate enhancement (SRE) circuit of the present invention coupled to a low power operational amplifier circuit 900. The operational amplifier 900 comprises a single polarity PMOS front end. In the embodiment shown in FIG. 9, a turnaround for the SRE current has been provided because the current mirror in the folded cascode has been moved to the PMOS side.

Figure 10:
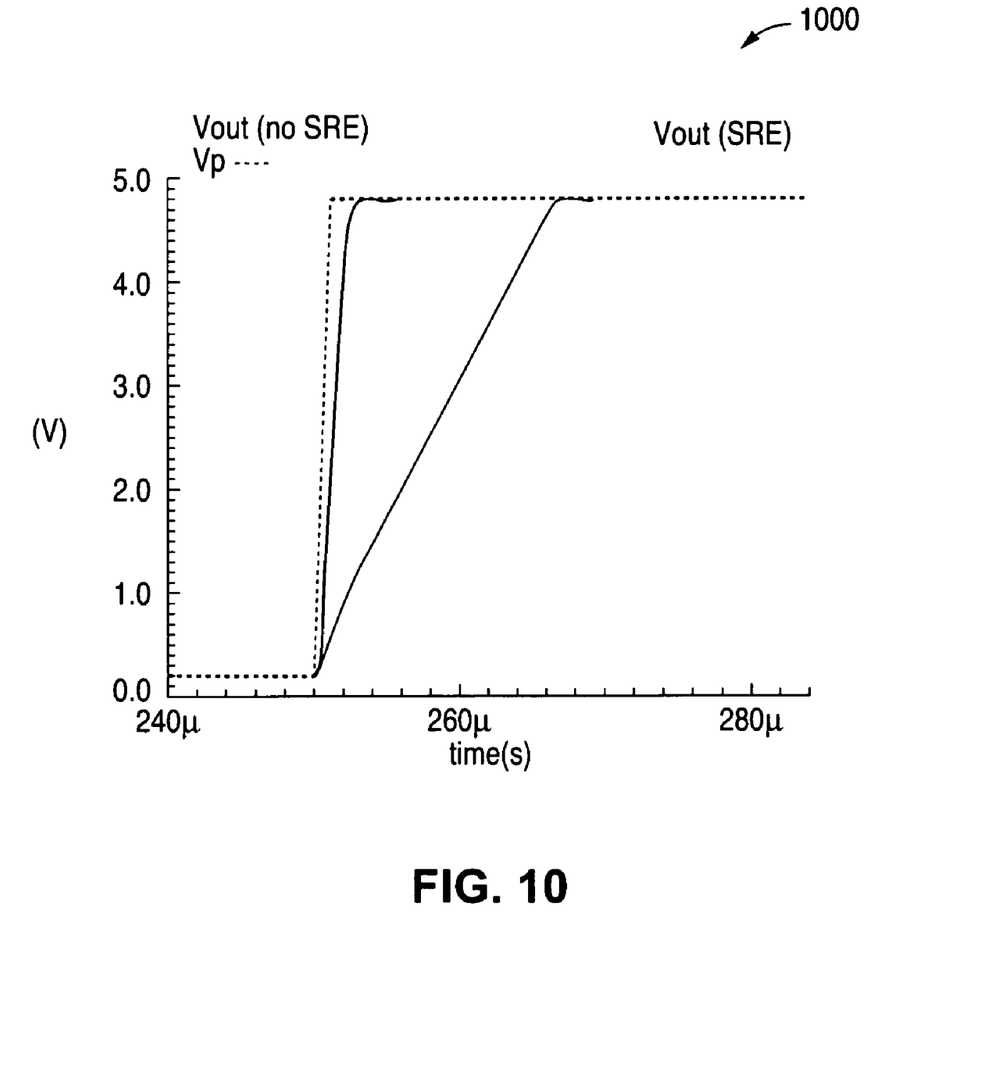
FIG. 10 illustrates a graph of voltage versus time showing the transient response of the low power operational amplifier circuit shown in FIG. 9 as the voltage is increased.

FIG. 10 illustrates a graph 1000 of voltage versus time showing the transient response of the low power operational amplifier circuit 900 shown in FIG. 9 as the voltage is increased. The graph 1000 is a simulation result of the operational amplifier 900 operated with a load of five thousand ohms (5 kΩ) of resistance in series with thirty picofarads (30 pF) of capacitance. The quiescent current of the operational amplifier 900 is nine hundred thirty three nanoamperes (933 nA) and the slew rate enhancement (SRE) circuit's quiescent current is two hundred sixty microamperes (260 μA). The compensation capacitor has a capacitance of approximately thirty three hundredths of a picofarad (0.33 pF).

As shown in FIG. 10, the slew rate for increasing voltage without the slew rate enhancement (SRE) circuit of the present invention is approximately three tenths volts per microsecond (0.3 volts/μsec). The slew rate for increasing voltage with the slew rate enhancement (SRE) circuit of the present invention is approximately two volts per microsecond (2 volts/μsec). The simulated slew rate is increased by a factor of six and six tenths (6.6).

The settling time for increasing voltage is decreased from seventeen microseconds (17 μs) to less than four microseconds (4 μs). The settling time with the slew rate enhancement (SRE) circuit is approximately one quarter of the settling time that is required without the slew rate enhancement (SRE) circuit.

Key metrics for low power circuits for portable applications include low power, compactness, simplicity and robustness (yield), and offset. The slew rate enhancement (SRE) circuit of the present invention greatly increases the speed of operational amplifier circuits with minimal bias current cost. Because the present invention mitigates internal slew rate limitations, the class AB output stage of operational amplifiers can be sized to accommodate driving various sizes of loads.

The slew rate enhancement (SRE) system of the present invention does not change the small signal dynamics or offset of the operational amplifiers because the slew rate enhancement (SRE) is off during quiescent operation. In addition, because the slew rate enhancement (SRE) system is very compact and requires low power, the operational amplifier circuits can be scaled to use minimum power. An additional feature of the slew rate enhancement (SRE) system is that larger compensation capacitors may be used to increase phase margin without detriment to the internal slew rate.

The foregoing description has outlined in detail the features and technical advantages of the present invention so that persons who are skilled in the art may understand the advantages of the invention. Persons who are skilled in the art should appreciate that they may readily use the conception and the specific embodiment of the invention that is disclosed as a basis for modifying or designing other structures for carrying out the same purposes of the present invention. Persons who are skilled in the art should also realize that such equivalent constructions do not depart from the spirit and scope of the invention in its broadest form.

Although the present invention has been described with an exemplary embodiment, various changes and modifications may be suggested to one skilled in the art. It is intended that the present invention encompass such changes and modifications as fall without the scope of the appended claims.

What is claimed is:

1. A slew rate enhancement circuit that increases a slew rate in a two stage complementary metal oxide semiconductor (CMOS) amplifier, said slew rate enhancement circuit comprising:
   a circuit that receives a Vn input signal that is input to said two stage CMOS amplifier;
   a circuit that receives a Vp input signal that is input to said two stage CMOS amplifier;
   a circuit that detects a voltage difference between said Vn input signal and said Vp input signal;
   a first current source coupled to a first portion of said two stage CMOS amplifier; and
   a second current source coupled to a second portion of said two stage CMOS amplifier
   wherein the slew rate enhancement circuit, in response to detecting a difference in voltage between said Vn input signal and said VP input signal, sends a signal to turn on one of: said first current source and said second current source.

2. The slew rate enhancement circuit as set forth in claim 1 wherein the slew rate enhancement circuit, in response to detecting that the Vn input signal and the Vp input signal are equal, sends a signal to turn off the first current source and sends a signal to turn off the second current source.

3. The slew rate enhancement circuit as set forth in claim 1 wherein the slew rate enhancement circuit, in response to detecting that the Vn input signal is greater than the Vp input signal, turns on the first current source to charge a first compensation capacitor of said two stage CMOS amplifier.

4. The slew rate enhancement circuit as set forth in claim 1 wherein the slew rate enhancement circuit, in response to detecting that the Vp input signal is greater than the Vn input signal, turns on the second current source to charge a second compensation capacitor of said two stage CMOS amplifier.

5. The slew rate embodiment circuit as set forth in claim 1 wherein said slew rate enhancement circuit turns on one of: said first circuit source and said second current source depending upon a polarity of an input signal transition.

6. The slew rate enhancement circuit as set forth in claim 5 wherein said slew rate enhancement circuit turns on said first current source when said slew rate enhancement circuit determines that said Vu input signal is greater than said Vp input signal.

7. The slew rate enhancement circuit as set forth in claim 6 wherein said first current source charges a first compensation capacitor of said two stage CMOS amplifier.

8. The slew rate enhancement circuit as set forth in claim 5 wherein said slew rate enhancement circuit turns on said second current source when said slew rate enhancement circuit determines that said Vp input signal is greater than said Vn input signal.

9. The slew rate enhancement circuit as set forth in claim 8 wherein said first current source charges a second compensation capacitor of said two stage CMOS amplifier.

10. The slew rate enhancement circuit as set forth in claim 1 wherein said slew rate enhancement circuit increases a slew rate of said two stage CMOS amplifier by a factor of approximately four to five.

11. The slew rate enhancement circuit as set forth in claim 1 wherein said slew rate enhancement circuit decreases a settling time of said two stage CMOS amplifier following a voltage transition by a factor of approximately three.

12. The slew rate enhancement circuit as set forth in claim 1 wherein said two stage complementary metal oxide semiconductor (CMOS) amplifier comprises one of:
   an operational amplifier having a quiescent current of approximately forty microamperes; and
   an ultra low power operational amplifier having a quiescent current of approximately one microampere.

13. A slew rate enhancement circuit that increases a slew rate in a two stage complementary metal oxide semiconductor (CMOS) amplifier, said slew rate enhancement circuit comprising:
   a first NMOS transistor MS1 having a gate coupled to a Vn input signal that is input to said two stage CMOS amplifier and having a drain that is coupled to a Vboostn node;
   a second NMOS transistor MS2 having a gate coupled to a Vp input signal that is input to said two stage CMOS amplifier and having a drain that is coupled to a Vboostp node;
   a third NMOS transistor MS3 having a drain that is coupled to a source of said first NMOS transistor and to a source of said second NMOS transistor, and having a gate coupled to an Nbias signal of said two stage CMOS amplifier, and having a source that is coupled to ground;
   a first PMOS transistor MS4 having a drain coupled to said Vboostn node, and having a source coupled to a power supply vdda of said two stage CMOS amplifier, and having a gate coupled to a Pbias signal of said two stage CMOS amplifier;
   a second PMOS transistor MS5 having a drain coupled to said Vboostn node, and having a source coupled to said power supply vdda of said two stage CMOS amplifier, and having a gate coupled to said Pbias signal of said two stage CMOS amplifier;
   a third PMOS transistor MS6 having a gate coupled to said Vboostn node, and having a source coupled to said power supply vdda of said two stage CMOS amplifier, and having a drain coupled to a Node X of said two stage CMOS amplifier; and
   a fourth PMOS transistor MS7 having a gate coupled to said Vboostp node, and having a source coupled to said power supply vdda of said two stage CMOS amplifier, and having a drain coupled to a Node Y of said two stage CMOS amplifier.

14. The slew rate enhancement circuit as set forth in claim 13
wherein the slew rate enhancement circuit turns off the third PMOS transistor MS6 and turns off the fourth PMOS transistor MS7 when the Vn input signal is equal to the Vp input signal.

15. The slew rate enhancement circuit as set forth in claim 14
wherein the slew rate enhancement circuit turns on the fourth PMOS transistor MS7 when the Vp input signal is greater than the Vn input signal; and
wherein the slew rate enhancement circuit turns on the third PMOS transistor MS6 when the Vn input signal is greater then the Vp input signal.

16. The slew rate enhancement circuit as set forth in claim 13 wherein:
Node X is coupled to a first compensation capacitor C0 of said two stage CMOS amplifier; and
Node Y is coupled to a second compensation capacitor C1 of said two stage CMOS amplifier through a current mirror circuit of said two stage CMOS amplifier.

17. A method for enhancing a slew rate in a two stage complementary metal oxide semiconductor (CMOS) amplifier, said method comprising the steps of:
coupling a slew rate enhancement circuit to said two stage CMOS amplifier;
detecting in said slew rate enhancement circuit an input signal transition in said two stage CMOS amplifier; and
in response to detecting said input signal transition, turning on at least one current source to charge at least one compensation capacitor of said two stage CMOS amplifier.

18. The method as set forth in claim 17 further comprising the steps of:
receiving in said slew rate enhancement circuit a Vn input signal and a Vp input signal that is input to said two stage CMOS amplifier, and
detecting a difference in voltage between said Vn input signal and said Vp input signal.

19. The method as set forth in claim 18 further comprising the steps of:
determining that said Vn input signal is greater than said Vp input signal;
and in response to said determination turning on a first current source of said slew rate enhancement circuit to charge a first compensation capacitor of said two stage CMOS amplifier.

20. The method as set forth in claim 18 further comprising the steps of:
determining that said Vp input signal is greater than said Vn input signal;
and in response to said determination turning on a second current source of said slew rate enhancement circuit to charge a second compensation capacitor of said two stage CMOS amplifier.

* * * * *

UNITED STATES PATENT AND TRADEMARK OFFICE
CERTIFICATE OF CORRECTION

PATENT NO.        : 7,362,173 B1
APPLICATION NO.   : 11/285586
DATED             : April 22, 2008
INVENTOR(S)       : Imre Knausz It is certified that error appears in the above-identified patent and that said Letters Patent is hereby corrected as shown below:

Column 7, line 16, delete "without" and replace with --within--.

Signed and Sealed this

Twelfth Day of August, 2008

JON W. DUDAS
*Director of the United States Patent and Trademark Office*